United States Patent [19]

Martin

[11] Patent Number: 5,192,881
[45] Date of Patent: Mar. 9, 1993

[54] CIRCUIT WHICH REDUCES NOISE CAUSED BY HIGH CURRENT OUTPUTS

[75] Inventor: William C. Martin, Carrollton, Tex.

[73] Assignee: VLSI Technology, Inc., Sa Jose, Calif.

[21] Appl. No.: 723,110

[22] Filed: Jun. 28, 1991

[51] Int. Cl.[5] .................... H03K 15/173; H03K 17/16
[52] U.S. Cl. .................................. 307/468; 307/270; 307/469; 307/443
[58] Field of Search ............... 307/443, 270, 465, 468, 307/469, 451

[56] References Cited

U.S. PATENT DOCUMENTS

| | | | |
|---|---|---|---|
| 4,638,187 | 1/1987 | Boler | 307/451 |
| 4,719,369 | 1/1988 | Asano et al. | 307/469 |
| 4,855,623 | 8/1989 | Flaherty | 307/270 |
| 4,959,563 | 9/1990 | Schenck | 307/468 |
| 5,039,874 | 8/1991 | Anderson | 307/451 |
| 5,089,722 | 2/1992 | Amedeo | 307/451 |

Primary Examiner—Edward P. Westin
Assistant Examiner—Andrew Sanders
Attorney, Agent, or Firm—The Hickman Law Firm

[57] ABSTRACT

Circuitry within a device provides an output signal to an output pad of the device. One of a plurality of current levels is selected. When a first current level is selected, the circuitry generates only a first amount of current to maintain the output signal on the output pad. When a second current level is selected, the circuitry, in addition to the first amount of current, generates a second amount of current to maintain the output signal on the output pad. The first current level may be used in a test mode. In this way high current switching noise can be eliminated during testing. The second current level may then be used in a normal operating mode.

12 Claims, 8 Drawing Sheets

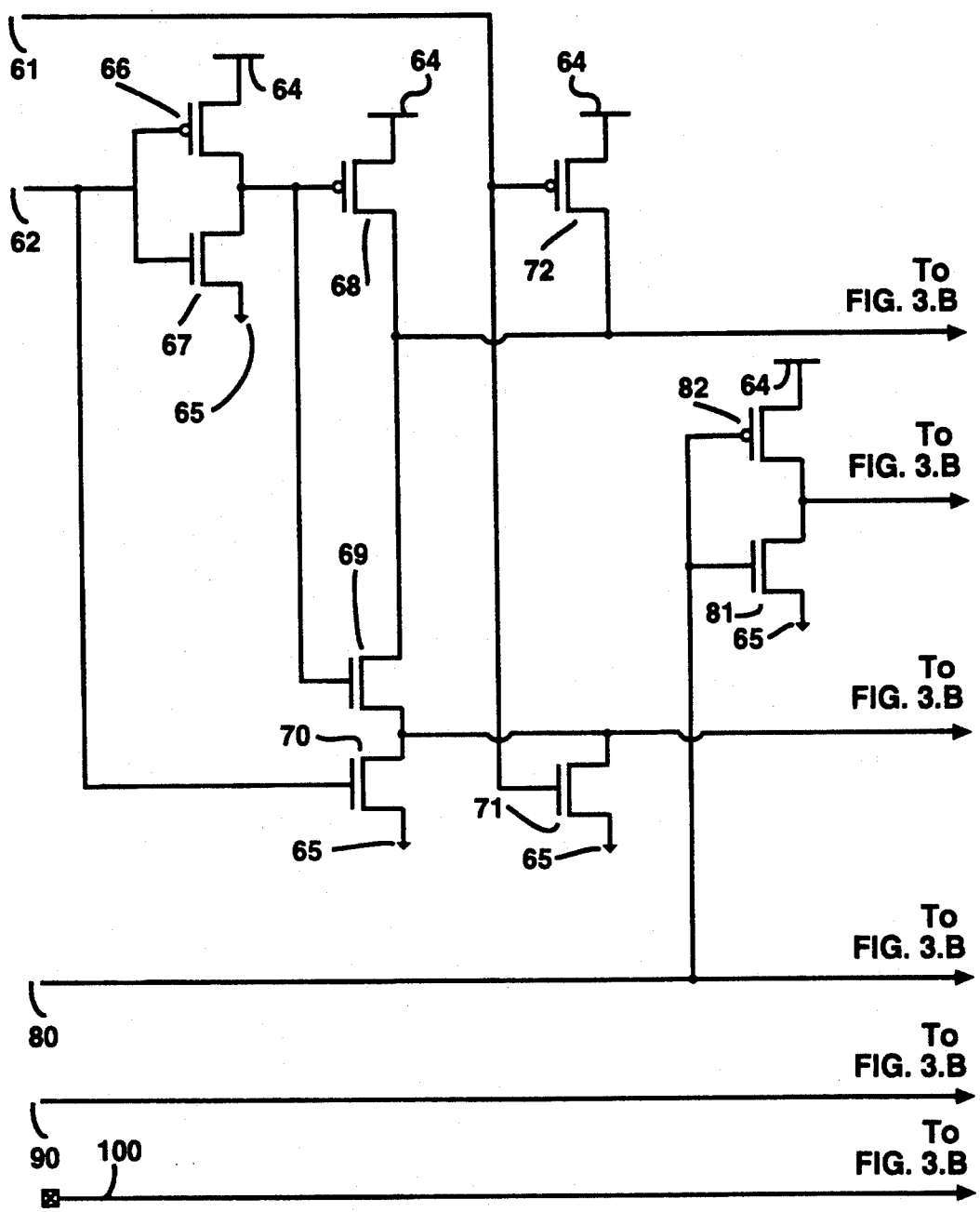
FIG. 3.A

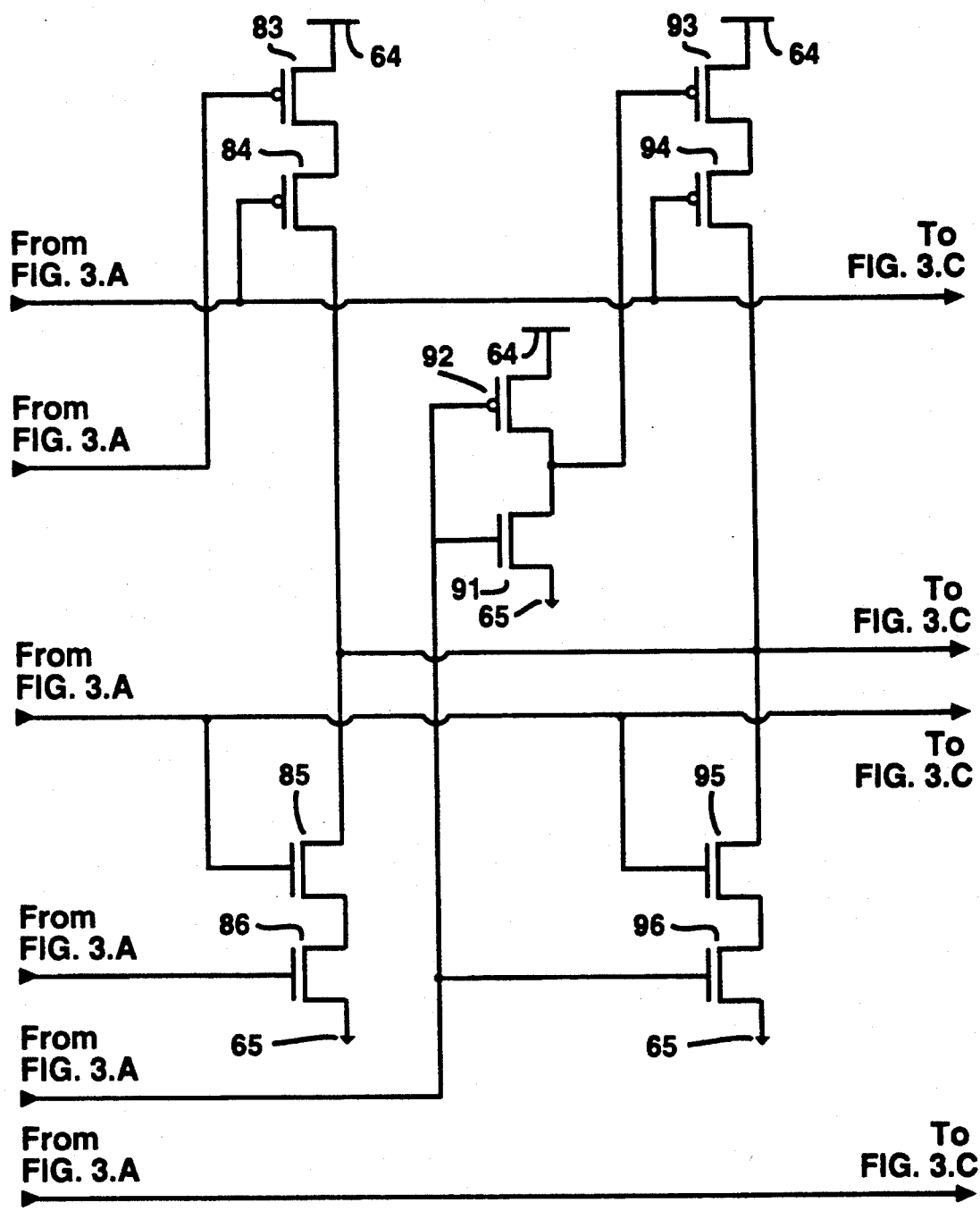
FIG. 3.B

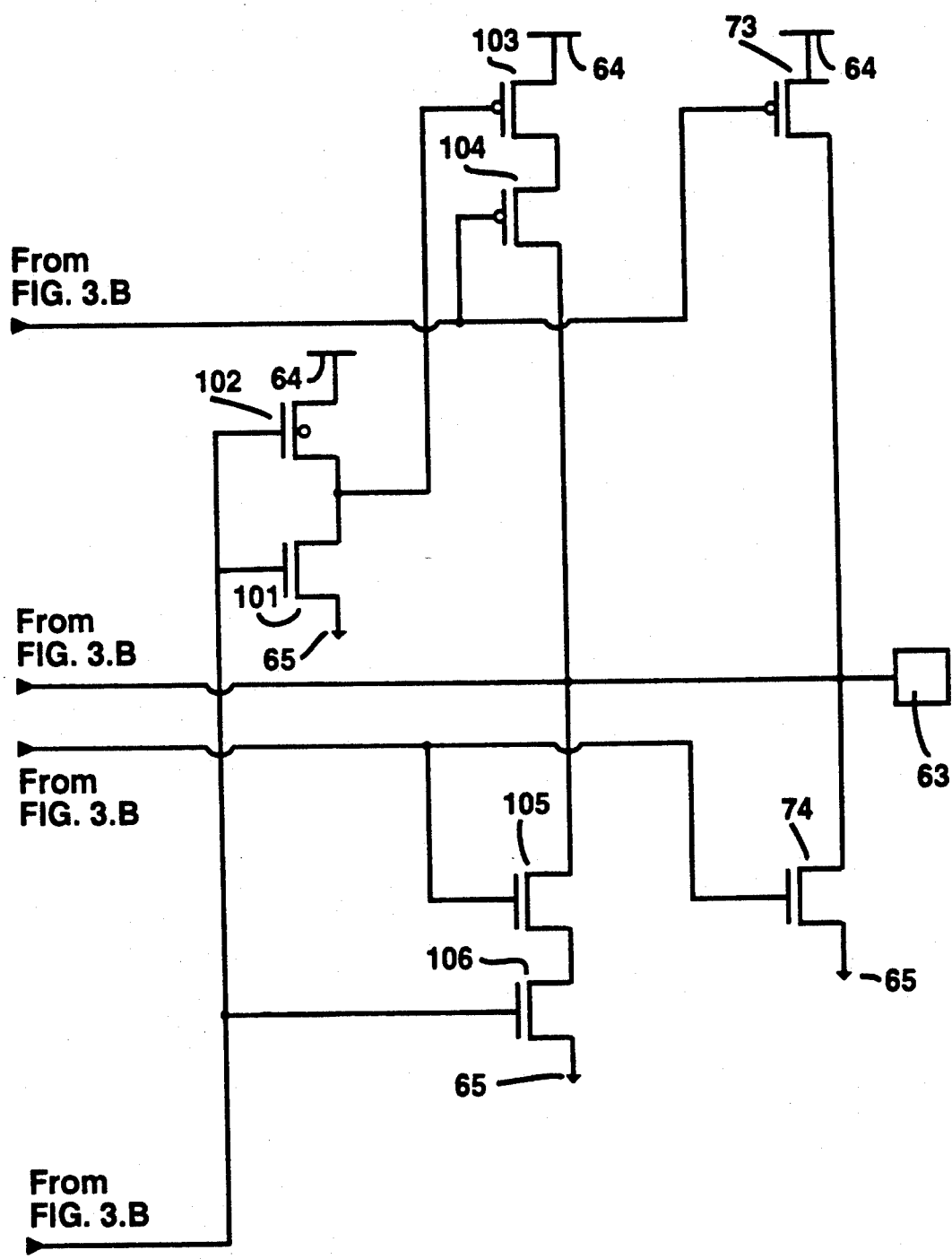
FIG. 3.C

CIRCUIT WHICH REDUCES NOISE CAUSED BY HIGH CURRENT OUTPUTS

BACKGROUND

The present invention concerns the supply of a plurality of current levels to an output pad in a device. The invention is useful for reducing such high current switching noise during testing.

When designing devices such as integrated circuits, it is necessary to design output logic circuitry so that sufficient current is available at device outputs to drive the input of other devices. The current needed at an output depends on a number of factors which include the number of devices to be driven by a particular output (i.e., the fan-out of the output), the capacitance of each of the inputs of the devices to be driven, and the desired switching speed.

When output circuitry is designed to generate high current, switching a value on the output often results in high current switching noise. Occurrence of the high current switching noise during testing can result in device failure.

In some cases, devices which are able to function acceptably in applications which require a high current output, may fail testing performed in a typical test environment because of high current switching noise and poor test electronics. In such cases, in the prior art, it was then necessary to either over design the output circuitry of the device so that the device could pass the performance test, or to design custom testers or modify existing testers in order to effectively test the devices.

SUMMARY OF THE INVENTION

In accordance with the preferred embodiment of the present invention, circuitry within a device is presented which provides an output signal to an output pad of the device. One of a plurality of current levels is selected. When a first current level is selected, the circuitry generates only a first amount of current to maintain the output signal on the output pad. When a second current level is selected, the circuitry, in addition to the first amount of current, generates a second amount of current to maintain the output signal on the output pad.

When the circuitry provides only two current levels, the first current level may be used in a test mode. In this way high current switching noise ca be eliminated during testing. The second current level may then be used as a normal operating mode. Alternately, the first current level may be used when the device is utilized in applications where only a limited amount of output current is required.

Other embodiments of the invention may include more than two current levels. For example, when a third current level is selected, the circuitry generates, in addition to the first amount of current and/or the second amount of current, a third amount of current to maintain the output signal on the output pad. Similarly, when a fourth current level is selected, the circuitry generates, in addition to the first amount of current, the second amount of current and/or the third amount of current, a fourth amount of current to maintain the output signal on the output pad.

DESCRIPTION OF THE PRIOR ART

Figure 1:
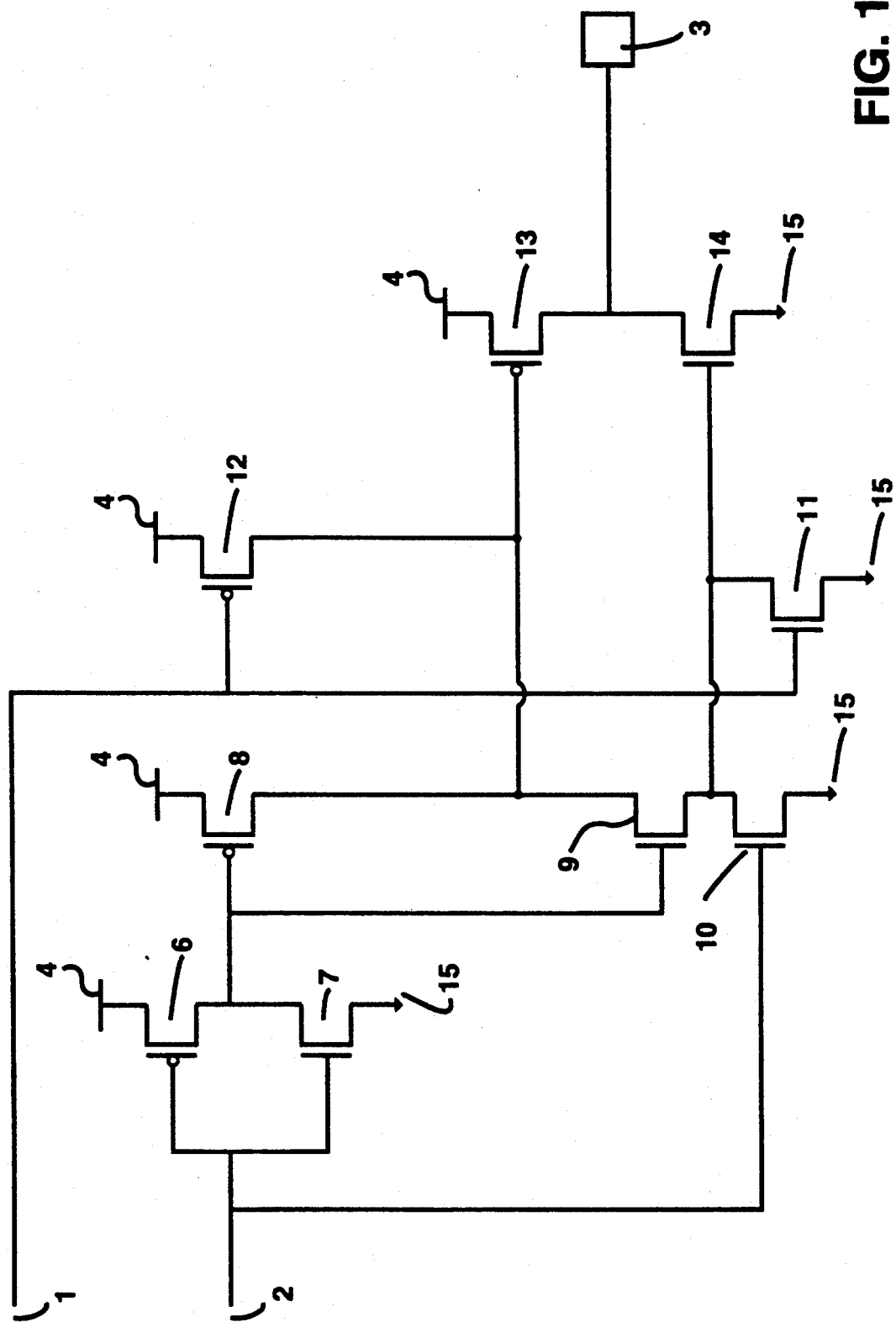
FIG. 1 shows output circuitry of a device in accordance with the prior art.

FIG. 1 shows prior art output driver circuitry for a CMOS device. Values are placed on a pad 3 in accordance with values on an output value line 1 and an output enable line 2. A p-gate transistor 13 and an n-gate transistor 14 serve as an output driver for pad 3. Each of n-gate transistor 14 and p-gate transistor 13 is able to drive an amount of current as selected by the user. A reference voltage 15 connected to n-gate transistor 14 is at ground (logic 0). A power voltage 4 connected to p-gate transistor 13 is, for example, at five volts (logic 1).

When output enable line 2 is held at logic 1, output to pad 3 is disabled. This is accomplished as follows. When output enable line 2 is at logic 1, an n-gate transistor 10 is turned on. When n-gate transistor 10 is on, a gate of n-gate transistor 14 is held at logic 0, turning off n-gate transistor 14. Also, when output enable line 2 is at logic 1, an inverter consisting of a p-gate transistor 6 and an n-gate transistor 7 places a logic 0 on a gate of p-gate transistor 8. This turns on p-gate transistor 8. When p-gate transistor 8 is on, a gate of p-gate transistor 13 is held at logic 1, turning off p-gate transistor 13. Also, an n-gate transistor 9 is turned off isolating the gate of p-gate transistor 13 from n-gate transistor 14, allowing both p-gate transistor 13 and n-gate transistor 14 to be turned off simultaneously. When both p-gate transistor 13 and n-gate transistor 14 are turned off, output to pad 3 is disabled.

When output enable line 2 is held at logic 0, output to pad 13 is enabled. When output enable line 2 is held at logic 0, n-gate transistor 10 is turned off, p-gate transistor 8 is turned off and n-gate transistor 9 is turned on. Then, the logic value placed on the gate of p-gate transistor 13 and n-gate transistor 14 is controlled by a p-gate transistor 12 and an n-gate transistor 11. N-gate transistor 11 and p-gate transistor 12 invert the logic value placed on output value line 1 and place the inverted logic value on the gate of p-gate transistor 13 and the gate of n-gate transistor 14. The inverted logic value o the gate of p-gate transistor 13 and n-gate transistor 14 is inverted by n-gate transistor 14 and p-gate transistor 13 and placed on output pad 3.

DESCRIPTION OF THE PREFERRED EMBODIMENT

Figure 2:
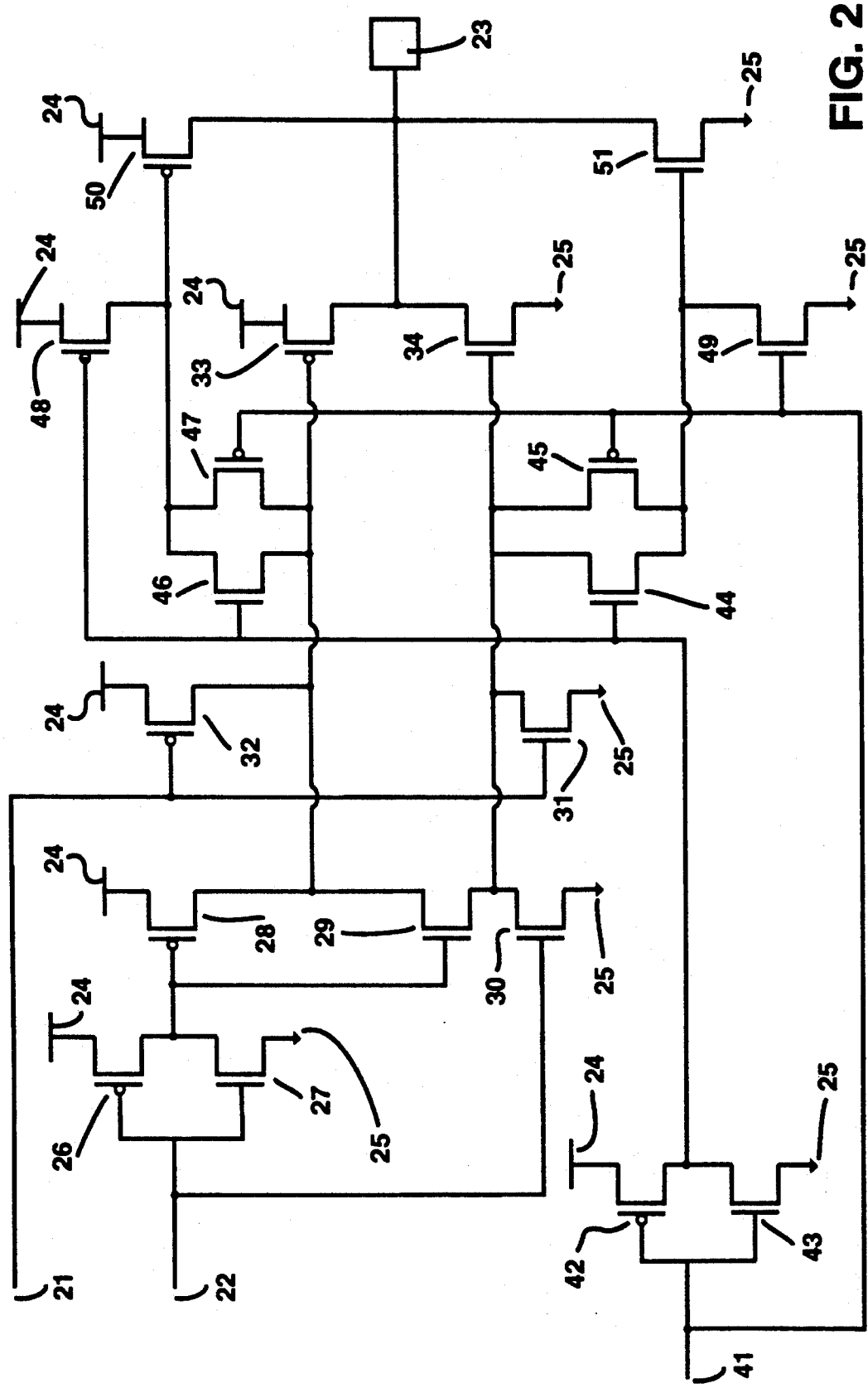
FIG. 2 shows output circuitry of a device in accordance with a preferred embodiment of the present invention.

FIG. 2 shows output driver circuitry for a CMOS device in accordance with a preferred embodiment of the present invention. Values are placed on a pad 23 in accordance with values on an output value line 21 and an output enable line 22. A p-gate transistor 33 and an n-gate transistor 34 serve as an output driver for pad 23. Each of n-gate transistor 34 and p-gate transistor 33 is able to drive an amount of current as selected by the user. A reference voltage 25 connected to n-gate transistor 34 is at ground (logic 0). A power voltage 24 connected to p-gate transistor 33 is, for example, at five volts (logic 1).

When output enable line 22 is held at logic 1, output to pad 23 is disabled. This is accomplished as follows. When output enable line 22 is at logic 1, an n-gate transistor 30 is turned on. When n-gate transistor 30 is on, a gate of n-gate transistor 34 is held at logic 0, turning off n-gate transistor 34. Also, when output enable line 22 is at logic 1, an inverter consisting of a p-gate transistor 26 and an n-gate transistor 27 places a logic 0 on a gate of p-gate transistor 28. This turns on p-gate transistor 28. When p-gate transistor 28 is on, a gate of p-gate transistor 33 is held at logic 1, turning off p-gate transistor 33. Also, an n-gate transistor 29 is turned off isolating the gate of p-gate transistor 33 from n-gate transistor 34, allowing both p-gate transistor 33 and n-gate transistor 34 to be turned off simultaneously. When both p-gate transistor 33 and n-gate transistor 34 are turned off, output to pad 23 is disabled.

When output enable line 22 is held at logic 0, output to pad 33 is enabled. When output enable line 22 is held at logic 0, n-gate transistor 30 is turned off, p-gate transistor 28 is turned off and n-gate transistor 29 is turned on. Then, the logic value placed on the gate of p-gate transistor 33 and n-gate transistor 34 is controlled by a p-gate transistor 32 and an n-gate transistor 31. N-gate transistor 31 and p-gate transistor 33 invert the logic value placed on output value line 21 and place the inverted logic value on the gate of p-gate transistor 33 and the gate of n-gate transistor 34. The inverted logic value on the gate of p-gate transistor 33 and n-gate transistor 34 is inverted by n-gate transistor 34 and p-gate transistor 33 and placed on output pad 23.

A logic value placed on a mode input line 41 determines whether pad 23 is driven in a low current mode or in a high current mode. For low current driving of pad 23 only p-gate transistor 33 and n-gate transistor 34 are used to drive pad 23. In this case, a logic 1 is placed on mode input line 41. The logic 1 on mode input line 41 is used to turn on an n-gate transistor 49 and to turn off a p-gate transistor 45 and a p-gate transistor 47. The logic 1 on mode input line 41 is inverted to produce a logic 0 by an inverter consisting of a p-gate transistor 42 and an n-gate transistor 43. The logic 0 produced by the inverter is used to turn on a p-gate transistor 48 and to turn off an n-gate transistor 44 and an n-gate transistor 46. When n-gate transistor 46 is off, p-gate transistor 47 is off and p-gate transistor 48 is on, a p-gate transistor 50 is turned off and the gate of p-gate transistor 50 is isolated from the gate of p-gate transistor 33. When n-gate transistor 44 is off, p-gate transistor 45 is off and n-gate transistor 49 is on, an n-gate transistor 51 is turned off and the gate of n-gate transistor 51 is isolated from the gate of n-gate transistor 34.

When driving pad 23 is in high current mode, n-gate transistor 51 and p-gate transistor 50 are used as an additional driver for pad 23. Each of n-gate transistor 51 and p-gate transistor 50 is able to drive an amount of current as selected by the user. This current is in addition to the current driven by p-gate transistor 33 and n-gate transistor 34. When driving pad 23 is in high current mode, a logic 0 is placed on mode input line 41. As a result, n-gate transistor 44, p-gate transistor 45, n-gate transistor 46 and p-gate transistor 47 are all turned on. Also, p-gate transistor 48 and n-gate transistor 49 are both turned off. Therefore, the gate of p-gate transistor 50 is electrically connected to the gate of p-gate transistor 33 and the gate of n-gate transistor 51 is electrically connected to the gate of n-gate transistor 34.

The output driver circuitry shown in FIG. 2 may be used, for example, to provide a test mode for a circuit. The test mode is the low current mode. When operating in the test mode, a logic 1 is placed on mode input line 41 allowing only p-gate transistor 33 and n-gate transistor 34 to be used to drive current to pad 23. This allows the device to be tested without high current switching noise. Once the device is tested and the functionality of the device confirmed, then a logic 0 is placed on mode input line 41 allowing p-gate transistor 50 and n-gate transistor 51 to also supply current to pad 23. The device may then be tested in high current mode to determine whether high DC current levels can be supplied. Typically, high current mode is used as a normal operating mode of the device.

Further, in applications that do not require high current drive, the device can be programmed for a lower current mode to reduce switching noise which can functionally degrade the device.

Figure 4:
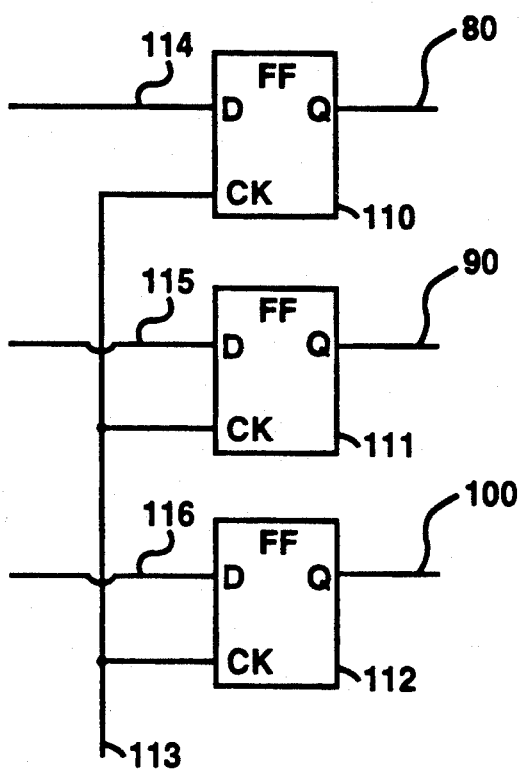
FIGS. 4 and 5 show alternate embodiments for utilizing a register to store a value which determines available output current supplied by the output circuitry shown in FIG. 3 in accordance with the alternate preferred embodiment of the present invention.
Figure 5:
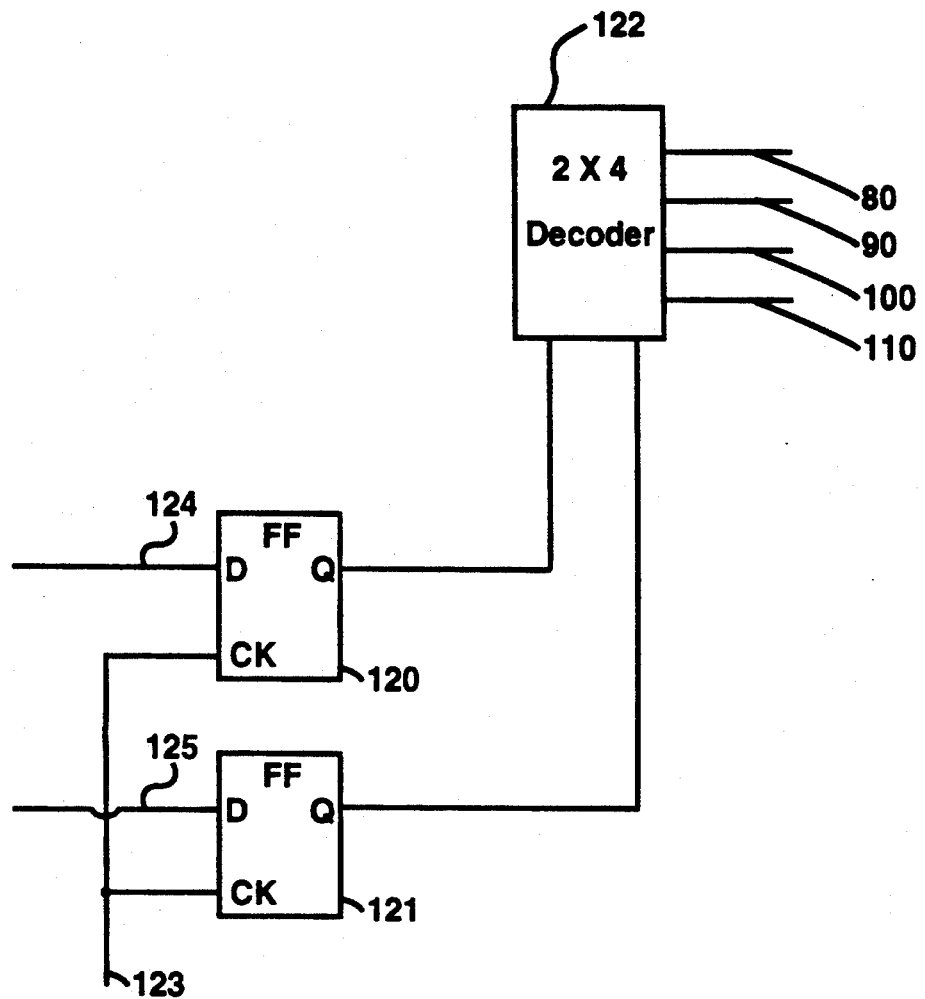

There are many other embodiments in which the present invention may be used. For example, the output current of a device may be adjustable dependent upon a value in a configuration register. Such an embodiment is shown in FIG. 3, FIG. 4 and FIG. 5.

Figure 3:
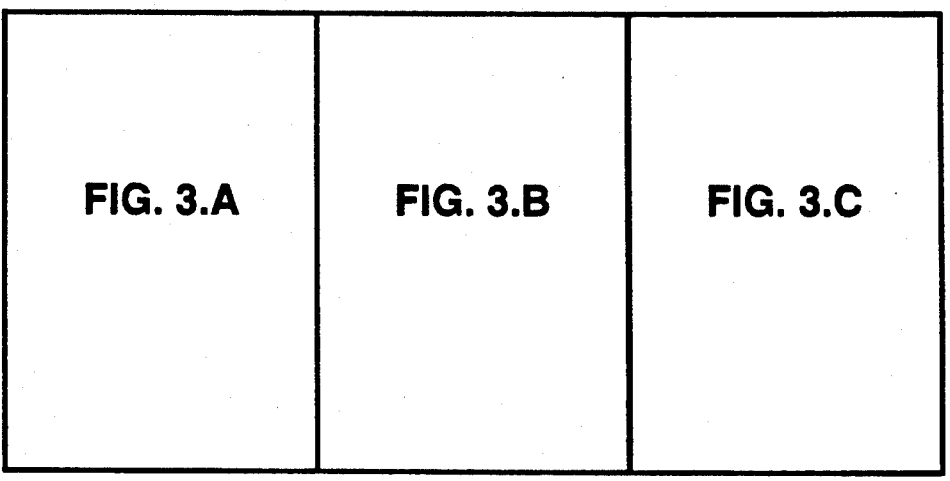
FIGS. 3a-c show output circuitry of a device in accordance with an alternate preferred embodiment of the present invention.

In the device shown in FIG. 3, values are placed on a pad 63 in accordance with values on an output value line 61 and an output enable line 62. A p-gate transistor 73 and an n-gate transistor 74 serve as an output driver for pad 63. Each of n-gate transistor 74 and p-gate transistor 73 is able to drive, for example, two milliamps of current. A reference voltage 65 connected to n-gate transistor 74 is at ground (logic 0). A power voltage 64 connected to p-gate transistor 75 is, for example, at five volts (logic 1).

When output enable line 62 is held at logic 1, output to pad 63 is disabled. This is accomplished as follows. When output enable line 62 is at logic 1, an n-gate transistor 70 is turned on. When n-gate transistor 70 is on, a gate of n-gate transistor 74 is held at logic 0, turning off n-gate transistor 74. Also, when output enable line 62 is at logic 1, an inverter consisting of a p-gate transistor 66 and an n-gate transistor 67 places a logic 0 on a gate of p-gate transistor 68. This turns on p-gate transistor 68. When p-gate transistor 68 is on, a gate of p-gate transistor 73 is held at logic 1, turning off p-gate transistor 73. Also, an n-gate transistor 69 is turned off isolating the gate of p-gate transistor 73 from n-gate transistor 74, allowing both p-gate transistor 73 and n-gate transistor 74 to be turned off simultaneously. When both p-gate transistor 73 and n-gate transistor 74 are turned off, output to pad 63 is disabled.

When output enable line 62 is held at logic 0, output to pad 73 is enabled. When output enable line 62 is held at logic 0, n-gate transistor 70 is turned off, p-gate transistor 68 is turned off and n-gate transistor 69 is turned on. Then, the logic value placed on the gate of p-gate transistor 73 and n-gate transistor 74 is controlled by a p-gate transistor 72 and an n-gate transistor 71. N-gate transistor 71 and p-gate transistor 72 invert the logic value placed on output value line 61 and place the inverted logic value on the gate of p-gate transistor 73 and the gate of n-gate transistor 74. The inverted logic value on the gate of p-gate transistor 73 and n-gate transistor 74 is inverted by n-gate transistor 74 and p-gate transistor 73 and placed on output pad 63.

A mode input line 80, a mode input line 90 and a mode input line 100 control whether additional current is provided to pad 63. When mode input line 80, mode input line 90 and mode input line 100 are all held at logic 0, only p-gate transistor 73 and n-gate transistor 74 are used to drive current to pad 63.

When mode input line 80 is at logic 1, current to pad 63 is additionally driven through a p-gate transistor 83 and a p-gate transistor 84 and driven through an n-gate transistor 85 and an n-gate transistor 86. This occurs because the logic 1 on mode input line 80 turns on n-gate transistor 86 allowing pad 63 to sink current through n-gate transistors 85 and 86 when n-gate transistor 85 is turned on. N-gate transistor 85 turns on and off simultaneously with n-gate transistor 74 since their gates are electrically connected together. Also, the logic 1 on mode input line 80 is inverted by an inverter consisting of a p-gate transistor 82 and an n-gate transistor 81, and the resulting logic 0 turns on p-gate transistor 83. This allows pad 63 to source current through p-gate transistors 83 and 84 when p-gate transistor 84 is turned on. P-gate transistor 84 turns on and off simultaneously with p-gate transistor 73 since their gates are electrically connected together.

When mode input line 90 is at logic 1, current to pad 63 is additionally driven through a p-gate transistor 93 and a p-gate transistor 94 and driven through an n-gate transistor 95 and an n-gate transistor 96. This occurs because the logic 1 on mode input line 90 turns on n-gate transistor 96 allowing pad 63 to sink current through n-gate transistors 95 and 96 when n-gate transistor 95 is turned on. N-gate transistor 95 turns on and off simultaneously with n-gate transistor 74 since their gates are electrically connected together. Also, the logic 1 on mode input line 90 is inverted by an inverter consisting of a p-gate transistor 92 and an n-gate transistor 91, and the resulting logic 0 turns on p-gate transistor 93. This allows pad 63 to source current through p-gate transistors 93 and 94 when p-gate transistor 94 is turned on. P-gate transistor 94 turns on and off simultaneously with p-gate transistor 73 since their gates are electrically connected together.

When mode input line 100 is at logic 1, current to pad 63 is additionally driven through a p-gate transistor 103 and a p-gate transistor 104 and driven through an n-gate transistor 105 and an n-gate transistor 106. This occurs because the logic 1 on mode input line 100 turns on n-gate transistor 106 allowing pad 63 to sink current through n-gate transistors 105 and 106 when n-gate transistor 105 is turned on. N-gate transistor 105 turns on and off simultaneously with n-gate transistor 74 since their gates ar electrically connected together. Also, the logic 1 on mode input line 100 is inverted by an inverter consisting of a p-gate transistor 102 and an n-gate transistor 101, and the resulting logic 0 turns on p-gate transistor 103. This allows pad 63 to source current through p-gate transistors 103 and 104 when p-gate transistor 104 is turned on. P-gate transistor 104 turns on and off simultaneously with p-gate transistor 73 since their gates are electrically connected together.

FIG. 4 shows a D flip-flop 110, a D flip-flop 111 and a D flip-flop 112 which can be used to store logic signals used to drive mode input line 80, mode input line 90 and mode input line 100. Values may be stored in flip-flops 110, 111 and 112 by a user of the device respectively placing signals on input lines 114, 115 and 116. A clock line 113 is used to clock the signals into flip-flops 110, 111 and 112.

FIG. 5 shows an alternate design in which a D flip-flop 120 and a D flip-flop 121 store values which are decoded by a 2 to 4 decoder 122 in order to drive mode input line 80, mode input line 90 and mode input line 100. An additional output 110 of decoder 122 may also be used to drive a mode input line. Values may be stored in flip-flops 120 and 121 by a user of the device respectively placing signals on input lines 124 and 125. A clock line 123 is used to clock the signals into flip-flops 120 and 121.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:
1. A buffer circuit comprising:
input circuitry for receiving an input signal;
an output on which the buffer circuit places an output signal;
a reference voltage;
a power voltage;
a first transistor having a first gate, a first source and a first drain, the first gate being coupled to the input circuitry, the first source being coupled to the power voltage, and the first drain being coupled to the output;
a second transistor having a second gate, a second source and a second drain, the second gate being coupled to the input circuitry, the second source being coupled to the output, and the second drain being coupled to the reference voltage;
a third transistor having a third gate, a third source and a third drain, the third gate being electrically connected directly to the first gate, and the third drain being coupled to the output;
a fourth transistor having a fourth gate, a fourth source and a fourth drain, the fourth gate being electrically connected directly to the second gate, and the fourth source being coupled to the output;
a fifth transistor having a fifth gate, a fifth source and a fifth drain, the fifth source being coupled to the power voltage, and the fifth brain being coupled to the third source;
a sixth transistor having a sixth gate, a sixth source and a sixth drain, the sixth source being coupled to the fourth drain, and the sixth drain being coupled to the reference voltage; and
first selection circuitry means, coupled to the fifth gate and the sixth gate, for turning off the fifth transistor and the sixth transistor when a first amount of output current is selected, and for turning on the fifth transistor and the sixth transistor when a second amount of output current is selected.

2. A buffer circuit as in claim 1 wherein the first transistor, the third transistor and the fifth transistor are p-gate transistors and wherein the second transistor, the fourth transistor and the sixth transistor are n-gate transistors.

3. A buffer circuit as in claim 2 wherein the input circuitry includes:
a data input;

a seventh transistor having a seventh gate, a seventh source and a seventh drain, the seventh gate being coupled to the data input, the seventh source being coupled to the power voltage and the seventh drain being coupled to the first gate; and, an eighth transistor having an eighth gate, an eighth source and an eighth drain, the eighth gate being coupled to the data input, the eighth source being coupled to the second gate and the eighth drain being coupled to the reference voltage.

4. A buffer circuit as in claim 2 wherein the first selection circuitry means comprises:

a selection input coupled to the sixth gate; and, an inverter having an inverter input and an inverter output, the inverter input being coupled to the selection input and the inverter output being coupled to the fifth gate.

5. A buffer circuit as in claim 1 additionally comprising:

a seventh transistor having a seventh gate, a seventh source and a seventh drain, the seventh gate being electrically connected directly to the first gate, and the seventh drain being coupled to the output;

an eighth transistor having an eighth gate, an eighth source and an eighth drain, the eighth gate being electrically connected directly to the second gate, and the eighth source being coupled to the output;

a ninth transistor having a ninth gate, a ninth source and a ninth drain, the ninth source being coupled to the power voltage, and the ninth drain being coupled to the seventh source;

a tenth transistor having a tenth gate, a tenth source and a tenth drain, the tenth source being coupled to the eighth drain, and the tenth drain being coupled to the reference voltage; and, second selection circuitry means, coupled to the ninth gate and the tenth gate, for turning off the ninth transistor and the tenth transistor when the first amount of output current is selected and when the second amount of output current is selected, and for turning on the ninth transistor and the tenth transistor when a third amount of output current is selected.

6. A buffer circuit as in claim 5 wherein the first transistor, the third transistor, the fifth transistor, the seventh transistor and the ninth transistor are p-gate transistors and wherein the second transistor, the fourth transistor, the sixth transistor, the eighth transistor and the tenth transistor are n-gate transistors.

7. A buffer circuit as in claim 6 wherein the input circuitry includes:

a data input;

an eleventh transistor having an eleventh gate, an eleventh source and an eleventh drain, the eleventh gate being coupled to the data input, the eleventh source being coupled to the power voltage and the eleventh drain being coupled to the first gate; and, a twelfth transistor having a twelfth gate, a twelfth source and a twelfth drain, the twelfth gate being coupled to the data input, the twelfth source being coupled to the second gate and the twelfth drain being coupled to the reference voltage.

8. A buffer circuit as in claim 6 wherein the second selection circuitry means comprises:

a selection input coupled to the tenth gate; and, an inverter having an inverter input and an inverter output, the inverter input being coupled to the selection input and the inverter output being coupled to the ninth gate.

9. A buffer circuit as in claim 5 additionally comprising:

an eleventh transistor having an eleventh gate, an eleventh source and an eleventh drain, the eleventh gate being electrically connected directly to the first gate, and the eleventh drain being coupled to the output;

a twelfth transistor having a twelfth gate, a twelfth source and a twelfth drain, the twelfth gate being electrically connected directly to the second gate, and the twelfth source being coupled to the output;

a thirteenth transistor having a thirteenth gate, a thirteenth source and a thirteenth drain, the thirteenth source being coupled to the power voltage, and the thirteenth drain being coupled to the eleventh source;

a fourteenth transistor having a fourteenth gate, a fourteenth source and a fourteenth drain, the fourteenth source being coupled to the twelfth drain, and the fourteenth drain being coupled to the reference voltage; and, third selection circuitry means, coupled to the thirteenth gate and the fourteenth gate, for turning off the thirteenth transistor and the fourteenth transistor when the first amount of output current is selected, when the second amount of output current is selected, and when the third amount of output current is selected and for turning on the thirteenth transistor and the fourteenth transistor when a fourth amount of output current is selected.

10. A buffer circuit as in claim 9 wherein the first transistor, the third transistor, the fifth transistor, the seventh transistor, the ninth transistor, the eleventh transistor and the thirteenth transistor are p-gate transistors and wherein the second transistor, the fourth transistor, the sixth transistor, the eighth transistor, the tenth transistor, the twelfth transistor and the fourteenth transistor are n-gate transistors.

11. A buffer circuit as in claim 10 wherein the input circuitry includes:

a data input;

a fifteenth transistor having a fifteenth gate, a fifteenth source and a fifteenth drain, the fifteenth gate being coupled to the data input, the fifteenth source being coupled to the power voltage and the fifteenth drain being coupled to the first gate; and, a sixteenth transistor having a sixteenth gate, a sixteenth source and a sixteenth drain, the sixteenth gate being coupled to the data input, the sixteenth source being coupled to the second gate and the sixteenth drain being coupled to the reference voltage.

12. A buffer circuit as in claim 10 wherein the third selection circuitry means comprises:

a selection input coupled to the fourteenth gate; and an inverter having an inverter input and an inverter output, the inverter input being coupled to the selection input and the inverter output being coupled to the thirteenth gate.

* * * * *